(12) United States Patent
Koyama

(10) Patent No.: US 8,130,998 B2
(45) Date of Patent: Mar. 6, 2012

(54) MINIATURE SPEAKER DEVICE AND TELEVISION SET

(75) Inventor: Isao Koyama, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 402 days.

(21) Appl. No.: 12/476,632

(22) Filed: Jun. 2, 2009

(65) Prior Publication Data

US 2009/0316933 A1 Dec. 24, 2009

(30) Foreign Application Priority Data

Jun. 24, 2008 (JP) ................. 2008-163921

(51) Int. Cl.
*H04R 1/02* (2006.01)
*G01L 9/00* (2006.01)

(52) U.S. Cl. ...................... 381/387; 257/254

(58) Field of Classification Search ........... 381/57, 381/71.7, 336, 387; 438/50–53; 257/254, 257/416, E29.324

See application file for complete search history.

(56) References Cited

U.S. PATENT DOCUMENTS

| | | | | |
|---|---|---|---|---|
| 5,588,065 A * | 12/1996 | Tanaka et al. | ................. | 381/96 |
| 5,850,460 A * | 12/1998 | Tanaka et al. | ................. | 381/186 |
| 6,031,919 A * | 2/2000 | Funahashi et al. | ............ | 381/150 |
| 7,133,533 B2 * | 11/2006 | Chick et al. | ................... | 381/349 |
| 7,831,057 B2 * | 11/2010 | Jenkins | ........................ | 381/337 |

FOREIGN PATENT DOCUMENTS

| | | |
|---|---|---|
| JP | 9-70091 A | 3/1997 |
| JP | 11-150787 A | 6/1999 |
| JP | 2005-260625 A | 9/2005 |

* cited by examiner

*Primary Examiner* — Calvin Lee

(74) *Attorney, Agent, or Firm* — Crowell & Moring LLP

(57) ABSTRACT

A miniature speaker device includes a housing, a speaker mounted on the housing, a passive radiator mounted on the housing and vibrating in resonance with vibration of the speaker and having no driving system and a low frequency range amplification circuit for amplifying sound pressure in frequency components of a low frequency range of a single audio signal input in the speaker.

20 Claims, 9 Drawing Sheets

MINIATURE SPEAKER DEVICE AND TELEVISION SET

BACKGROUND OF THE INVENTION

1. Field of the Invention

The present invention relates to a miniature speaker device and a television set, and more particularly, it relates to a miniature speaker device and a television set each comprising a passive radiator.

2. Description of the Background Art

A speaker device comprising a passive radiator is known in general, as disclosed in Japanese Patent Laying-Open Nos. 11-150787, 2005-260625 and 9-70091, for example.

The aforementioned Japanese Patent Laying-Open No. 11-150787 discloses a speaker system comprising a main speaker (speaker), a passive radiator having a voice coil which is a drive system, a main amplifier (amplifier circuit) connected to the main speaker, a mixing amplifier connected to the main amplifier and mixing a signal for a center speaker and a signal for a subwoofer, and a motional feedback circuit connected to the passive radiator and amplifying sound pressure in frequency components of a low frequency range. This speaker system mixes the signal for the center speaker and the signal for the subwoofer, whereby the signal applied to the main speaker amplifies sound pressure of the mid frequency components in the mid and low frequency ranges. Thus, sounds generated from the main speaker are so formed that the sounds of the frequency components in the mid and low frequency ranges are amplified. Sounds generated from the passive radiator in resonance with the main speaker are so formed that sound pressure in the frequency components in the low frequency range is further amplified by the motional feedback circuit connected to the passive radiator.

The aforementioned Japanese Patent Laying-Open No. 2005-260625 discloses a speaker device comprising a cabinet (housing), a speaker unit (speaker) mounted on the cabinet, a passive radiator mounted on the same surface as the speaker unit (speaker) and a bass reflex duct coupled coaxially with the passive radiator and arranged inside the cabinet. This bass reflex duct of the speaker device has a first end coupled with an opening on a small diameter side of the passive radiator, to vibrate following vibration of the passive radiator. Consequently, the speaker device comprises effects as the passive radiator type speaker device and effects as the bass reflex type speaker device, thereby improving the acoustic characteristic in the low frequency range.

The aforementioned Japanese Patent Laying-Open No. 9-70091 discloses a speaker device comprising divided two enclosures (housings) to be fitted with each other, a speaker unit (speaker) arranged inside the enclosure, a passive radiator arranged at forward of the speaker unit and directed to the same direction as the speaker unit.

In the speaker system described in the aforementioned Japanese Patent Laying-Open No. 11-150787, however, the two signals for the center speaker and the subwoofer are needed in order to amplify the sounds of the frequency components in the mid and low frequency ranges. Thus, a circuit structure is disadvantageously complicated as compared with a case where a signal is input in order to input the two signals to the mixing amplifier. The motional feedback circuit must be provided on the passive radiator for amplifying sounds of the frequency components in the low frequency range, and hence the circuit structure is disadvantageously further complicated. The voice coil employed as the driving system and the like must be provided on the passive radiator in order to reflect feedback by the motional feedback circuit to the passive radiator, and hence the number of components are disadvantageously increased.

In the aforementioned speaker device described in the Japanese Patent Laying-Open No. 2005-260625, a member for amplifying the sound pressure in the frequency components in the low frequency range on the speaker unit is not provided, and hence the sound pressure in the frequency components in the low frequency range generated by the speaker unit is disadvantageously reduced. Thus, the sound pressure in the frequency components in the low frequency range is reduced also in the bass reflex duct and the passive radiator vibrating in resonance with the speaker unit, and hence it is conceivable that the sounds by the frequency components in the low frequency range are disadvantageously fully generated when the speaker device is downsized.

In the speaker device described in the aforementioned Japanese Patent Laying-Open No. 9-70091, only the passive radiator is provided, and hence the sounds by the frequency components in the low frequency range are disadvantageously fully generated when the speaker device is downsized.

SUMMARY OF THE INVENTION

The present invention has been proposed in order to solve the aforementioned problems, and an object of the present invention is to provide a miniature speaker device capable of fully emitting sounds by frequency components in a low frequency range while suppressing increase in the number of components and suppressing complication in a circuit structure also when downsized.

A miniature speaker device according to a first aspect of the present invention comprises a housing, a speaker mounted on the housing, a passive radiator mounted on the housing and vibrating in resonance with vibration of the speaker and having no driving system and a low frequency range amplification circuit for amplifying sound pressure in frequency components of a low frequency range of a single audio signal input in the speaker.

As hereinabove described, this miniature speaker device according to the first aspect comprises the passive radiator and the low frequency range amplification circuit for amplifying the sound pressure in the frequency components of the low frequency range of the audio signal, whereby the speaker vibrates to emit sounds and the passive radiator vibrates in resonance with vibration of the speaker to emit sounds in a state where the low frequency range is amplified in the low frequency range amplification circuit. Thus, the sound, whose low frequency range is amplified, emitted from the speaker and the sound emitted from the passive radiator resonating with vibration of the speaker where the low frequency range is amplified mix with each other, and hence the sound by the frequency components of the low frequency range can be fully emitted when the miniature speaker device is downsized. The single audio signal has only to be input in the low frequency range amplification circuit in order to amplify the sound pressure in the frequency components of the low frequency range, and hence the circuit structure can be simplified as compared with a case where two audio signals are input in the low frequency range amplification circuit. No motional feedback circuit must be provided on the passive radiator in order to amplify the sound by the frequency components of the low frequency range, and hence the circuit structure can be simplified. The passive radiator according to the present invention does not have a driving system such as a voice coil and hence increase in the number of components can be suppressed.

The aforementioned miniature speaker device according to the first aspect preferably further comprises a speaker device body including the speaker and the passive radiator, wherein the low frequency range amplification circuit is preferably so formed that sound pressure in the frequency components of at least 50 Hz and not more than 100 Hz which are in the low frequency range, generated from the speaker device body and sound pressure at a frequency of around 1 kHz are amplified to be substantially the same. According to this structure, the frequency components of at least 50 Hz and not more than 100 Hz, which are in the low frequency range, generated from the speaker device body can be amplified to substantially the same level as the sound pressure at a frequency of around 1 kHz which is a standard frequency.

In this case, the low frequency range amplification circuit is preferably so formed that sound pressure at a frequency of around 70 Hz which is in the low frequency range, generated from the speaker device body and the sound pressure at the frequency of around 1 kHz are amplified to be substantially the same. According to this structure, the frequency at around 70 Hz, which is in the low frequency range, generated from the speaker device body can be amplified to substantially the same level as the sound pressure at a frequency of around 1 kHz which is a standard frequency.

In the aforementioned miniature speaker device further comprising the speaker device body, the low frequency range amplification circuit is so preferably formed as to amplify the sound pressure in the frequency components of the low frequency range of at least 50 Hz and not more than 100 Hz. According to this structure, the sound pressure in the frequency components of the low frequency range which is the same range as the sound pressure generated from the speaker device body is amplified, and hence the frequency components of at least 50 Hz and not more than 100 Hz of the low frequency range, generated from the speaker device body can be further reliably amplified.

In this case, the low frequency range amplification circuit is preferably so formed as to most greatly amplify the sound pressure at a frequency of the low frequency range of around 70 Hz. According to this structure, the sound pressure at around 70 Hz, located on the lower frequency side at a frequency of at least 50 Hz and not more than 100 Hz and easily amplifiable to some extent is most greatly amplified, and hence the frequency components of the low frequency range generated from the speaker device body can be further reliably amplified.

In the aforementioned miniature speaker device further comprising the speaker device body, the passive radiator is preferably so formed that sound pressure in the frequency components of the low frequency range of at least 50 Hz and not more than 100 Hz is output to be larger than sound pressure in frequency components of more than 100 Hz. According to this structure, the passive radiator can further emphasis the sound pressure in the frequency components of the low frequency range of at least 50 Hz and not more than 100 Hz, and hence the frequency components in the low frequency range of at least 50 Hz and not more than 100 Hz can be fully amplified.

In this case, a frequency at which sound pressure output from the passive radiator reaches a maximum is preferably located on a lower frequency side than a frequency at which sound pressure is most greatly amplified in the low frequency range amplification circuit. According to this structure, the sound pressure in the frequency range lower than the low frequency range amplified in the low frequency range amplification circuit can be amplified in the passive radiator, and hence even the frequency components of the low frequency range which are difficult to be amplified by the low frequency range amplification circuit can be fully amplified.

In the aforementioned miniature speaker device in which the frequency at which the sound pressure from the passive radiator reaches the maximum is located on the lower frequency side than the frequency at which the sound pressure of the low frequency range amplification circuit is most greatly amplified, the passive radiator having no driving system includes a corn vibrating in resonance with vibration of the speaker and a spindle for adjusting a weight of the corn, supported by the corn, and the weight of the corn is so adjusted by the spindle that the corn resonates at a frequency of around 50 Hz in a state where the passive radiator having no driving system is mounted on the housing. According to this structure, the passive radiator having no driving system resonates at a frequency of around 50 Hz which is in the low frequency range, so that the passive radiator can be vibrated in resonance with vibration of the speaker in the low frequency range of more than around 50 Hz. Thus, in the low frequency range of more than around 50 Hz, the sound emitted from the speaker and the sound emitted from the passive radiator mix with each other, and hence the miniature speaker device can fully emit the sound by the frequency components of the low frequency range. The passive radiator is formed to resonate at around 50 Hz, whereby the sound pressure output from the passive radiator reaches the maximum at around 50 Hz. Thus, the frequency of the low frequency range at around 50 Hz which is difficult to be amplified by the low frequency range amplification circuit can be fully amplified.

The aforementioned miniature speaker device according to the first aspect preferably further comprises an automatic gain control circuit outputting the audio signal input in the low frequency range amplification circuit and keeping output to the low frequency range amplification circuit substantially constant, and an amplifier circuit for amplifying the audio signal output from the low frequency range amplification circuit. According to this structure, the low frequency range amplification circuit amplifies the sound pressure in the frequency components of the low frequency range of an output signal (audio signal) adjusted to a substantially constant by the automatic gain control circuit, and hence dispersion of the audio signal output from the low frequency range amplification circuit can be suppressed.

In the aforementioned miniature speaker device according to the first aspect, the housing preferably has a volume of at least 400 cm$^3$ and not more than 1000 cm$^3$. According to this structure, the sound by the frequency components in the low frequency range can be fully emitted even when the miniature speaker device has a small volume such as at least 400 cm$^3$ not more than 1000 cm$^3$, so far as the speaker device has the structure of the present invention.

In the aforementioned miniature speaker device according to the first aspect, the low frequency range amplification circuit preferably includes an operational amplifier and a feedback circuit portion connecting an input side and an output side of the operational amplifier and returning the input single audio signal from the output side of the operational amplifier to the input side of the operational amplifier, and the feedback circuit portion attenuates the sound pressure in frequency components of a high frequency range of the input single audio signal. According to this structure, the input single audio signal can be returned to the operational amplifier by the feedback circuit portion, and hence the input single audio signal can be amplified. The sound pressure in the frequency components of the high frequency range of the single audio signal input in the feedback circuit portion can be attenuated, and hence the sound pressure in the frequency components of the low frequency range can be amplified in the low frequency range amplification circuit.

In this case, the feedback circuit portion preferably has at least a capacitor and a resistance connected to the capacitor in parallel. According to this structure, the capacitor and the resistance connected to the capacitor in parallel can attenuate the sound pressure in the frequency components of the high frequency range of the single audio signal input, and hence the sound pressure in the frequency components of the low frequency range can be amplified in the low frequency range amplification circuit.

In the aforementioned miniature speaker device further comprising the automatic gain control circuit and the amplifier circuit, the passive radiator is not preferably electrically connected to the automatic gain control circuit, the low frequency range amplification circuit and the amplifier circuit, while the speaker is preferably electrically connected to the automatic gain control circuit, the low frequency range amplification circuit and the amplifier circuit. According to this structure, the passive radiator is not electrically connected to the automatic gain control circuit, the low frequency range amplification circuit and the amplifier circuit so that a driving portion is not required, and the sound pressure in the frequency components of the low frequency range can be amplified by the speaker electrically connected to the automatic gain control circuit, the low frequency range amplification circuit and the amplifier circuit.

A thin television set according to a second aspect of the present invention comprises a miniature speaker device including a housing, a speaker mounted on the housing, a passive radiator mounted on the housing and vibrating in resonance with vibration of the speaker and having no driving system and a low frequency range amplification circuit for amplifying sound pressure in frequency components of a low frequency range of a single audio signal input in the speaker.

In this thin television set according to a second aspect, as hereinabove described, the miniature speaker device includes the passive radiator and the low frequency range amplification circuit for amplifying the sound pressure in the frequency components of the low frequency range of the audio signal, whereby the speaker vibrates to emit sounds and the passive radiator vibrates in resonance with vibration of the speaker to emit sounds in a state where the low frequency range is amplified in the low frequency range amplification circuit. Thus, the sound, whose low frequency range is amplified, emitted from the speaker unit and the sound emitted from the passive radiator resonating with vibration of the speaker where the low frequency range is amplified mix with each other, and hence the sound by the frequency components of the low frequency range can be fully emitted when the miniature speaker device is downsized. The single audio signal has only to be input in the low frequency range amplification circuit in order to amplify the sound pressure in the frequency components of the low frequency range, and hence the circuit structure can be simplified as compared with a case where two audio signals are input in the low frequency range amplification circuit. No motional feedback circuit must be provided on the passive radiator in order to amplify the sound by the frequency components of the low frequency range, and hence the circuit structure can be simplified. The passive radiator according to the present invention does not have a driving system such as a voice coil and hence increase in the number of components can be suppressed.

In the aforementioned thin television set according to the second aspect, the miniature speaker device further preferably includes a speaker device body having the speaker and the passive radiator, and the low frequency range amplification circuit is preferably so formed that sound pressure in the frequency components of at least 50 Hz and not more than 100 Hz which are in the low frequency range, generated from the speaker device body and sound pressure at a frequency of around 1 kHz are amplified to be substantially the same. According to this structure, the frequency components of at least 50 Hz and not more than 100 Hz, which are in the low frequency range, generated from the speaker device body can be amplified to substantially the same level as the sound pressure at a frequency of around 1 kHz which is a standard frequency.

In this case, the passive radiator is preferably so formed that sound pressure in the frequency components of the low frequency range of at least 50 Hz and not more than 100 Hz is output to be larger than sound pressure in frequency components of more than 100 Hz. According to this structure, the passive radiator can further emphasis the sound pressure in the frequency components of the low frequency range of at least 50 Hz and not more than 100 Hz, and hence the frequency components in the low frequency range of at least 50 Hz and not more than 100 Hz can be fully amplified.

In the aforementioned thin television set in which the miniature speaker device further includes the speaker device body, a frequency at which sound pressure output from the passive radiator reaches a maximum is preferably located on a lower frequency side than a frequency at which sound pressure is most greatly amplified in the low frequency range amplification circuit. According to this structure, the sound pressure in the frequency range lower than the low frequency range amplified in the low frequency range amplification circuit can be amplified in the passive radiator, and hence even the frequency components of the low frequency range which are difficult to be amplified by the low frequency range amplification circuit can be fully amplified.

In the aforementioned thin television set in which the frequency at which the sound pressure output from the passive radiator reaches the maximum is located on the lower frequency side than the frequency at which the sound pressure of the low frequency range amplification circuit is most greatly amplified, the passive radiator having no driving system has a corn vibrating in resonance with vibration of the speaker and a spindle for adjusting a weight of the corn, supported by the corn, and the weight of the corn is so adjusted by the spindle that the corn resonates at a frequency of around 50 Hz in a state where the passive radiator having no driving system is mounted on the housing. According to this structure, the passive radiator having no driving system resonates at a frequency of around 50 Hz which is in the low frequency range, so that the passive radiator can be vibrated in resonance with vibration of the speaker in the low frequency range of more than around 50 Hz. Thus, in the low frequency range of more than around 50 Hz, the sound emitted from the speaker and the sound emitted from the passive radiator mix with each other, and hence the miniature speaker device of the thin television set can fully emit the sound by the frequency components of the low frequency range. The passive radiator is formed to resonate at around 50 Hz, whereby the sound pressure output from the passive radiator reaches the maximum at around 50 Hz. Thus, the frequency of the low frequency range at around 50 Hz which is difficult to be amplified by the low frequency range amplification circuit can be fully amplified.

In the aforementioned thin television set according to the second aspect, the miniature speaker device preferably further includes an automatic gain control circuit outputting the audio signal input in the low frequency range amplification circuit and keeping output to the low frequency range amplification circuit substantially constant and an amplifier circuit for amplifying the audio signal output from the low frequency range amplification circuit. According to this structure, the low frequency range amplification circuit amplifies the sound pressure in the frequency components of the low frequency range of an output signal (audio signal) adjusted to a substantially constant by the automatic gain control circuit, and hence dispersion of the audio signal output from the low frequency range amplification circuit can be suppressed.

In the aforementioned thin television set according to the second aspect, the low frequency range amplification circuit preferably has an operational amplifier and a feedback circuit portion connecting an input side and an output side of the operational amplifier and returning the input single audio signal from the output side of the operational amplifier to the input side of the operational amplifier, and the feedback circuit portion preferably attenuates the sound pressure in frequency components of a high frequency range of the input single audio signal. According to this structure, the input single audio signal can be returned to the operational amplifier by the feedback circuit portion, and hence the input single audio signal can be amplified. The sound pressure in the frequency components of the high frequency range of the single audio signal input in the feedback circuit portion can be attenuated, and hence the sound pressure in the frequency components of the low frequency range can be amplified in the low frequency range amplification circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to the drawings.

A thin television set 100 and miniature speaker devices 1 according to the embodiment of the present invention will be now described with reference to FIGS. 1 to 5.

Figure 1:
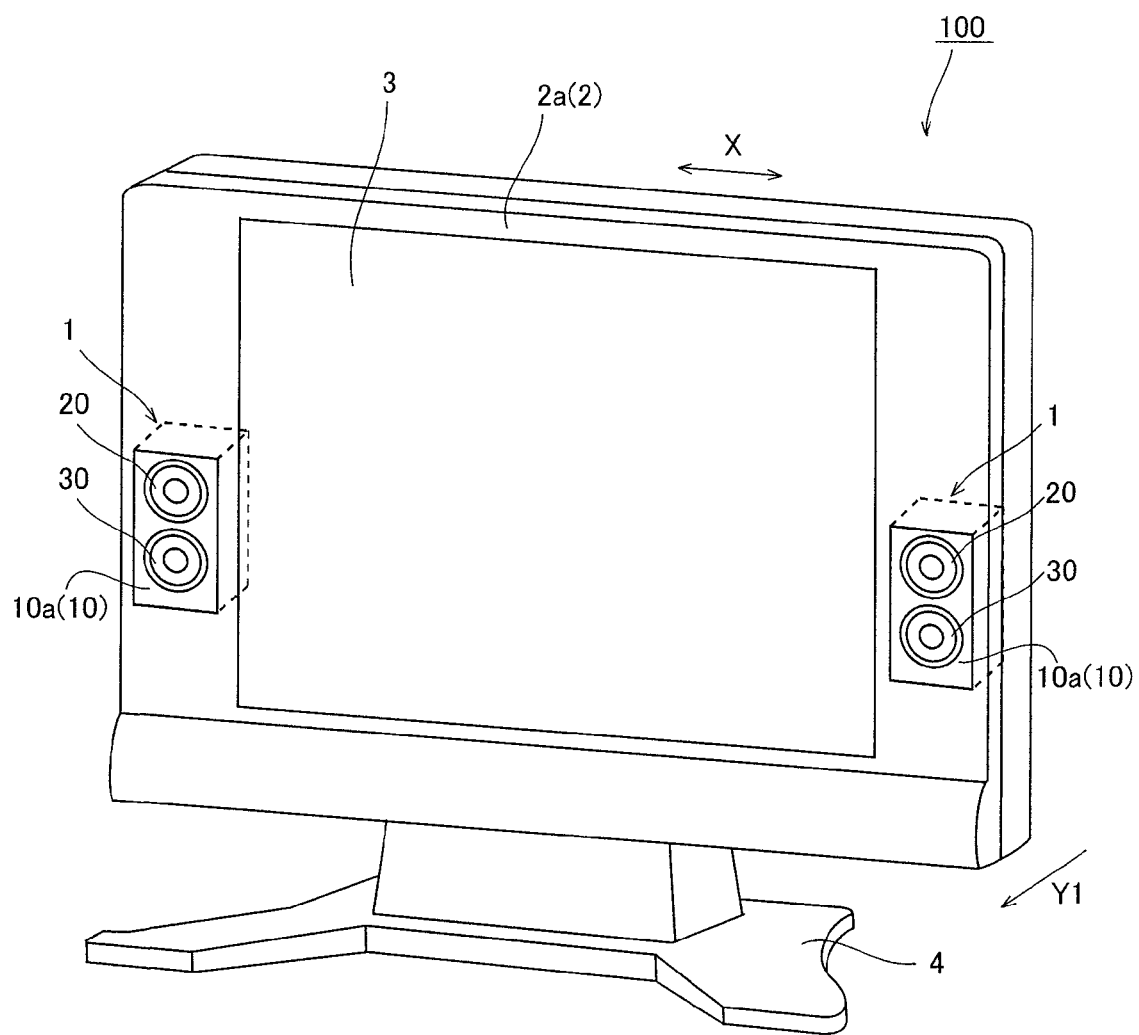
FIG. 1 is a perspective view showing a thin television set according to an embodiment of the present invention.

As shown in FIG. 1, the thin television set 100 according to the embodiment of the present invention comprises a television housing 2, an image display portion 3 arranged on a surface (front surface 2a) along arrow Y1 of the television housing 2 and displaying an image, a leg portion 4 supporting the television housing 2, and a pair of miniature speaker devices 1 provided on both side surfaces of the image display portion 3 along arrow X and arranged inside the television housing 2. The pair of miniature speaker devices 1 are so provided that surfaces (front surfaces 10a) of the speaker boxes 10, described later, of the miniature speaker devices 1 along arrow Y1 are arranged on the front surface 2a of the television housing 2.

Figure 2:
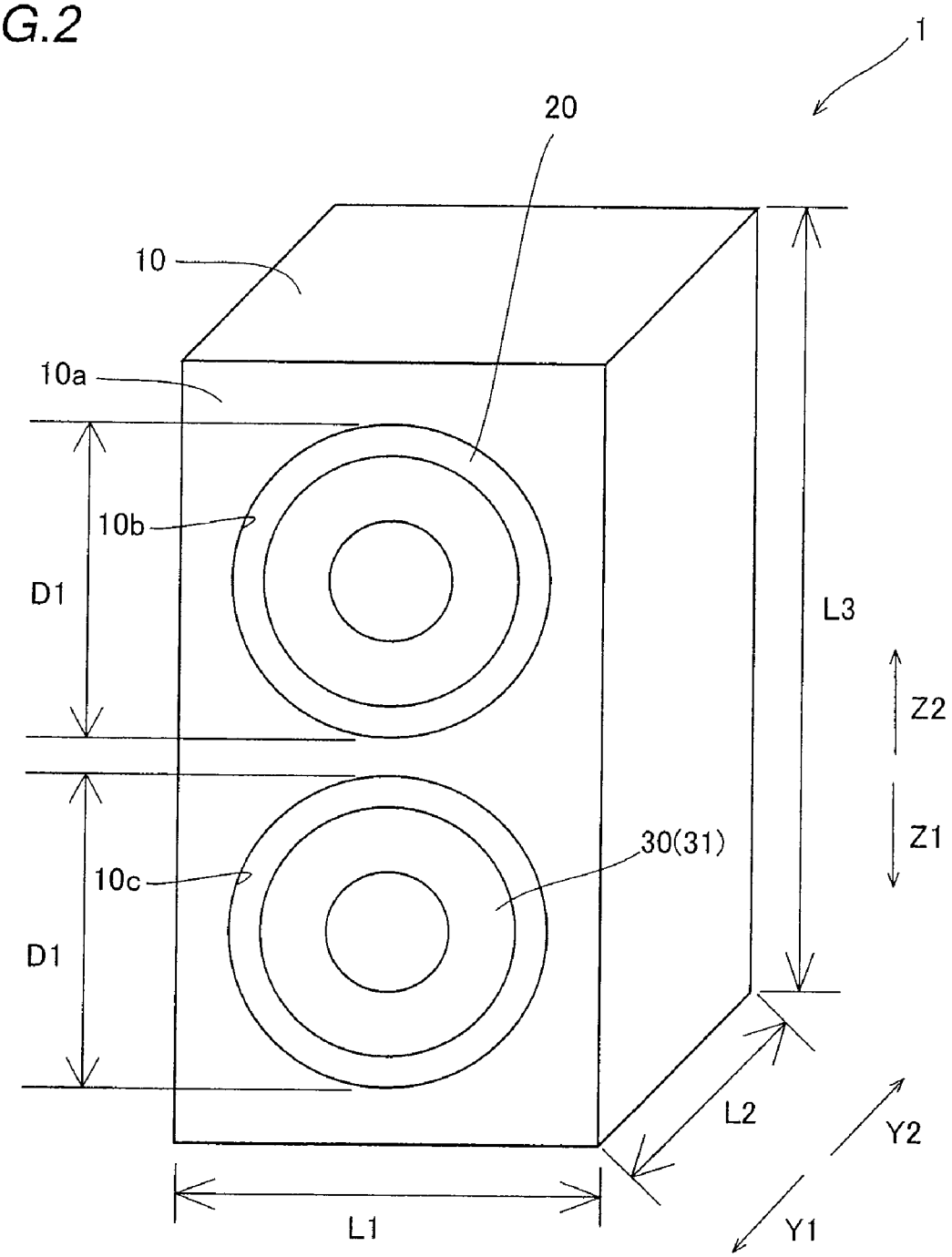
FIG. 2 is a perspective view showing a miniature speaker device of the thin television set according to the embodiment of the present invention shown in FIG. 1.
Figure 3:
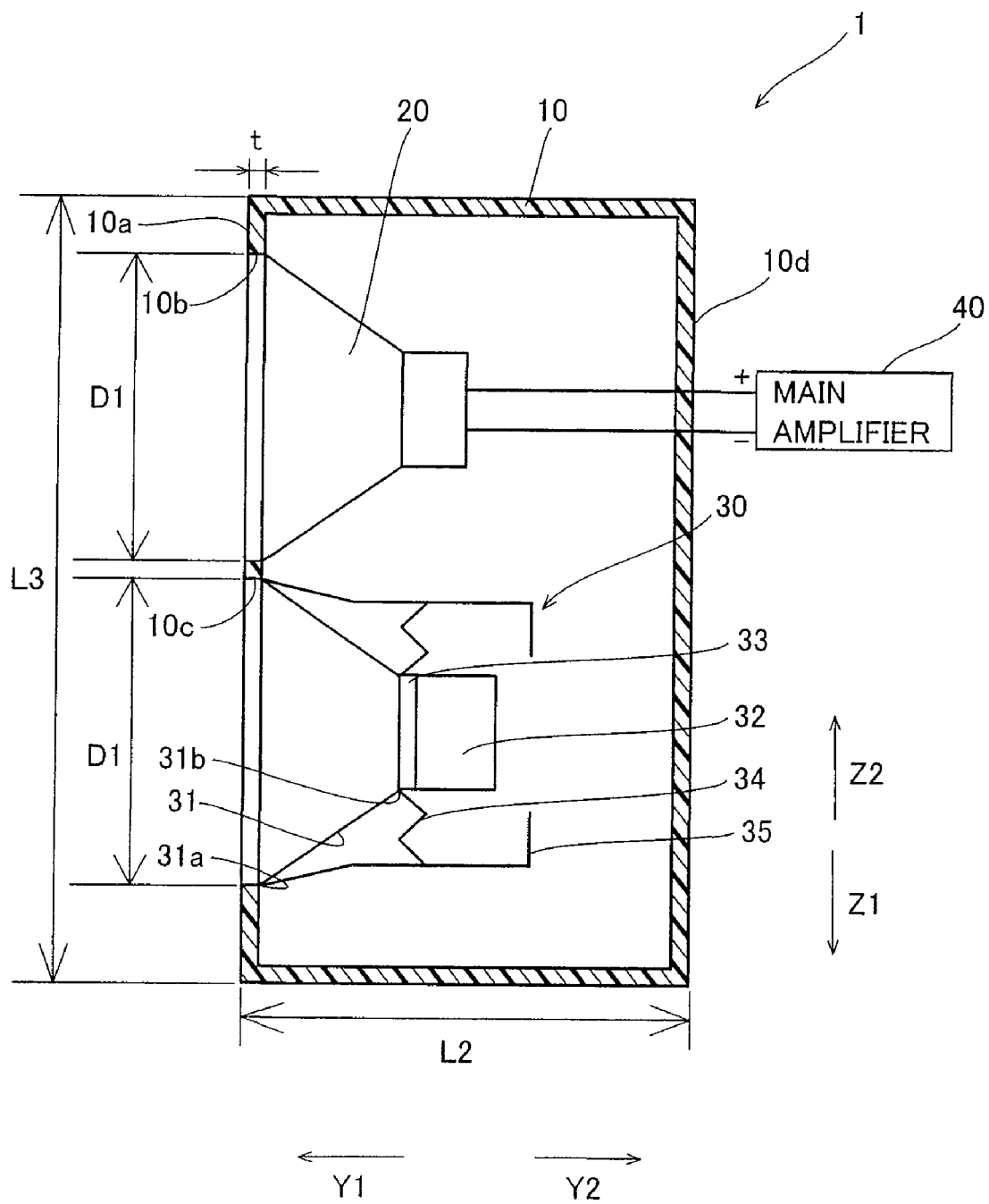
FIG. 3 is a diagram showing a structure of the miniature speaker device according to the embodiment of the present invention shown in FIG. 2.

The miniature speaker devices 1 are constituted by the speaker boxes 10 made of resin, speaker units 20, passive radiators 30, and a main amplifier 40 (see FIG. 3), as shown in FIGS. 2 and 3. Each of the speaker boxes 10, the speaker units 20 and the passive radiators 30 constitute the "speaker device body" in the this embodiment. The speaker box 10 is an example of the "housing" in this embodiment, and the speaker unit 20 is an example of the "speaker" in the present invention.

According to this embodiment, each of the speaker boxes 10 is formed in a box shape. Holes 10b and 10c for mounting the speaker unit 20 and the passive radiator 30 are provided on the front surface 10a of the speaker box 10. As shown in FIG. 2, the speaker box 10 has a width (L1) of about 80 mm, a depth (L2) of about 50 mm and a height (L3) of about 150 mm, and is formed in a so-called rectangular solid, as shown in FIG. 2. As shown in FIG. 3, the speaker box 10 has a thickness (t) of about 4 mm. Consequently, the volume of the speaker box 10 is about 500 cm$^3$.

As shown in FIGS. 2 and 3, the speaker unit 20 and the passive radiator 30 are mounted on the front surface 10a of each speaker box 10 and the passive radiator 30 is arranged below the speaker unit 20. As shown in FIG. 3, the speaker unit 20 is connected to the main amplifier 40 from a side of a back surface 10d of the speaker box 10 (surface along arrow Y2). Thus, the speaker unit 20 is electrically connected to a power amplifier 70, a low frequency range amplification circuit 60 and an AGC circuit 50, described later, of the main amplifier 40.

Figure 5:
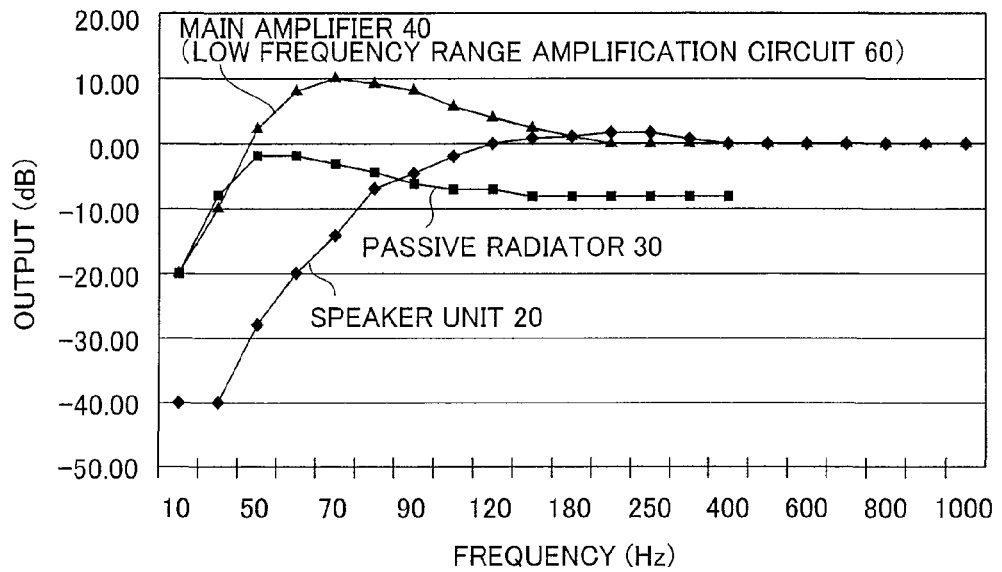
FIG. 5 is a diagram showing an amplification factor of the main amplifier and sound pressure frequency characteristics of the speaker unit and the passive radiator of the miniature speaker device according to the embodiment of the present invention shown in FIG. 2.

The speaker unit 20 is enabled to reproduce a full range of frequencies and is so formed that a resonance frequency is about 130 Hz. More specifically, in the speaker unit 20, sound pressure is reduced as a frequency is reduced at a frequency of not less than about 130 Hz which is the resonance frequency, as shown in FIG. 5. The speaker unit 20 is formed to have a diameter (D1) of about 50 mm, as shown in FIGS. 2 and 3. Rated input power of the speaker unit 20 is 15 W (watt), and the speaker unit 20 is enabled to correspond to an audio signal input from the main amplifier 40 (see FIG. 3) and having a large voltage.

As shown in FIG. 3, the passive radiator 30 is provided with a corn paper 31 mounted on the front surface 10a of the speaker box 10. This corn paper 31 has a large diameter portion 31a on the side of the front surface 10a of the speaker box 10 (along arrow Y1) and a small diameter portion 31b on the side of the back surface 10d of the speaker box 10 (along arrow Y2), and an inner diameter is reduced inward (along arrow Y2) of the speaker box 10 from the front surface 10a of the speaker box 10. The corn paper 31 is an example of the "corn" in the present invention. The corn paper 31 of the passive radiator 30 is enabled to vibrate in resonance with vibration of the speaker unit 20.

The passive radiator 30 is further provided with a bobbin 32 mounted on the small diameter portion 31b, a spindle 33 bonded to the bobbin 32, a damper 34 having a first end fixed to a mounting portion of the corn paper 31 and the bobbin 32 and a frame 35 fixed to a second end of the damper 34. The bobbin 32 and the spindle 33 are enabled to vibrate following vibration of the corn paper 31. The damper 34 has a function of attenuating vibration of the corn paper 31 and the bobbin 32 and the spindle 33 mounted on the corn paper 31. The passive radiator 30 is formed to have a diameter (D1) of about 50 mm which is the same as the speaker unit 20, as shown in FIGS. 2 and 3. As shown in FIG. 3, the passive radiator 30 is provided with no driving system, such as a permanent magnet and a voice coil, for electrically vibrating the corn paper 31. The passive radiator 30 is not connected to the main amplifier 40. Thus, the passive radiator 30 is not electrically connected to the power amplifier 70, the low frequency range amplification circuit 60 and the AGC circuit 50, described later, of the main amplifier 40.

According to this embodiment, the weight of the spindle 33 is so adjustable that the corn paper 31 of the passive radiator 30 resonates at a frequency of about 50 Hz in a state where the passive radiator 30 is mounted on the speaker box 10. In other words, the weight of the spindle 33 is changed to be smaller when the resonance frequency of the corn paper 31 is smaller than 50 Hz, while the weight of the spindle 33 is changed to be lager when the resonance frequency of the corn paper 31 is larger than 50 Hz. Thus, the spindle 33 is formed to be adjusted that the corn paper 31 resonates at a frequency of about 50 Hz. As shown in FIG. 5, in the passive radiator 30, sound pressure reaches the maximum at around the 50 Hz which is the resonance frequency.

Figure 4:
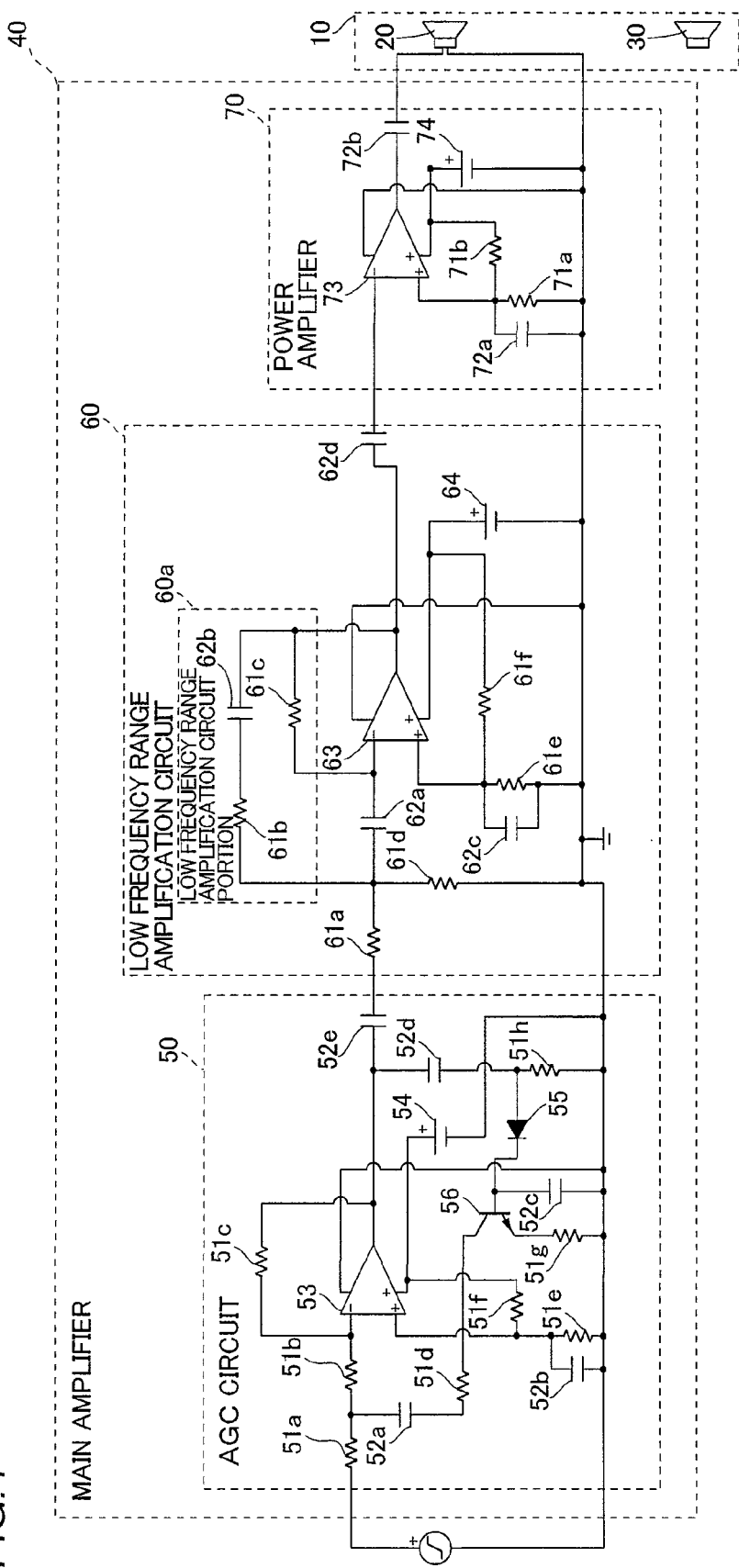
FIG. 4 is a diagram showing a circuit structure of a main amplifier of the miniature speaker device according to the embodiment of the present invention shown in FIG. 2.

As shown in FIG. 4, the main amplifier 40 is constituted by the AGC (automatic gain control) circuit 50, the low frequency range amplification circuit 60 and the power amplifier 70. The main amplifier 40 and the low frequency range amplification circuit 60 provided inside the main amplifier 40 are so formed as to amplify an input single audio signal, and the audio signal input in the main amplifier 40 is first input in the AGC circuit 50 keeping output substantially constant regardless of the input audio signal. The audio signal output from the AGC circuit 50 is input in the low frequency range amplification circuit 60 amplifying frequency components of a low frequency range. At this time, output of the AGC circuit 50 to the low frequency range amplification circuit 60 is kept substantially constant. Further, the audio signal output from the low frequency range amplification circuit 60 is input in the power amplifier 70 for amplifying the audio signal. Then, the audio signal output from the power amplifier 70 is formed to be input in the speaker unit 20. The low frequency range means a range of a frequency of not more than about 100 Hz in this application (the present invention).

More specifically, the AGC circuit 50 is constituted by resistances 51a to 51h, the capacitors 52a to 52e, operational amplifier 53 for amplifying an audio signal, a power supply 54 for putting the operational amplifier 53 in action, a diode 55 for rectifying an audio signal and a bipolar transistor 56. The AGC circuit 50 is an example of the "automatic gain control circuit" in the present invention. The low frequency range amplification circuit 60 is constituted by resistances 61a to 61h, the capacitors 62a to 62e, an operational amplifier 63 for amplifying an audio signal, a power supply 64 for putting the operational amplifier 63 in action. The power amplifier 70 is constituted by resistances 71a and 71b, the capacitors 72a and 72b, operational amplifier 73 for amplifying an audio signal, a power supply 74 for putting the operational amplifier 73 in action. The power amplifier 70 is an example of the "amplifier circuit" in the present invention.

The AGC circuit 50 is so formed that output from the AGC circuit 50 is kept substantially constant mainly by the diode 55 and the bipolar transistor 56. The AGC circuit 50 is so formed as to remove a DC component of the audio signal output from the operational amplifier 53 in the capacitor 52e and thereafter output the audio signal to the low frequency range amplification circuit 60. The power amplifier 70 is so formed that the operational amplifier 73 amplifies the audio signal input from the low frequency range amplification circuit 60 and the capacitor 72b removes the DC component of the audio signal output from the operational amplifier 73 and thereafter the resulting signal is output to the speaker unit 20.

In the low frequency range amplification circuit 60, a first electrode of the capacitor 52e of the AGC circuit 50 is connected to a first end of the resistance 61a. A second end of the resistance 61a is connected to first ends of the resistances 61b and 61d and a first electrode of the capacitor 62a. A second electrode of the capacitor 62a is connected to a first end of the resistance 61c and a first input terminal of the operational amplifier 63. An output terminal of the operational amplifier 63 is connected to a second end of the resistance 61c, a first electrode of the capacitor 62b and a first electrode of the capacitor 62d. A second electrode of the capacitor 62b is connected to a second end of the resistance 61b.

According to this embodiment, the resistances 61b, 61c and the capacitor 62b constitute a low frequency range amplification circuit portion 60a. In other words, frequency components in a high frequency range of the audio signal output from the operational amplifier 63 is attenuated by the resistance 61c and the capacitor 62b. Thus, only the frequency components of the low frequency range in the audio signal is returned to an input side of the operational amplifier 63, and hence only the audio signal of the low frequency range in the audio signal input in the low frequency range amplification circuit 60 is amplified, and the resulting signal is output from the low frequency range amplification circuit 60. The low frequency range amplification circuit portion 60a is an example of the "feedback circuit portion" in the present invention.

In the low frequency range amplification circuit 60, a second input terminal of the operational amplifier 63 is connected to first ends of the resistances 61e and 61f for operating the operational amplifier 63 and a first electrode of the capacitor 62c for grounding bias point (connecting point of the resistances 61e and 61d) in a alternating manner. A second end of the resistance 61f is connected to a positive electrode of the power supply 64 and a first power supply terminal of the operational amplifier 63.

In the low frequency range amplification circuit 60, a second end of the resistance 61d and a second end of the resistance 61e, a second electrode of the capacitor 62c, a second power supply terminal of the operational amplifier 63 and a negative electrode of the power supply 64 are grounded. The capacitor 62d of the low frequency range amplification circuit 60 is so formed as to remove the DC component of the audio signal output from the low frequency range amplification circuit 60, and the second electrode is connected to a first input terminal of the operational amplifier 73 of the power amplifier 70.

According to this embodiment, the sound pressure of the frequency component, of at least 50 Hz and not more than 100 Hz, output from the main amplifier 40 (low frequency range amplification circuit 60) is amplified as shown in FIG. 5, and is adjusted to be amplified to maximum at around 70 Hz. The sound pressure at 70 Hz output from the main amplifier 40 is adjusted to be amplified by about 10 db than sound pressure at 1 kHz which is a standard frequency. This amplification of the frequency components in the low frequency range is performed by amplification of the low frequency range by the low frequency range amplification circuit 60. Thus, the low frequency range amplification circuit 60 is so formed that the sound pressure at a frequency of around 70 Hz, which is in the low frequency range, generated from the speaker device body and the sound pressure at a frequency of around 1 kHz which is in the mid frequency range are amplified to substantially the same level.

The passive radiator 30 is formed to resonate at a frequency of 50 Hz as described above, whereby sound pressure in frequency components of a low frequency range of at least 50 Hz and not more than 100 Hz is output to be larger than sound pressure in frequency components exceeding 100 Hz. 50 Hz which is a frequency at which sound pressure output from the passive radiator 30 reaches a maximum is on a lower frequency side than 70 Hz which is a frequency at which sound pressure is most greatly amplified in the low frequency range amplification circuit 60.

According to this embodiment, as hereinabove described, the miniature speaker device 1 comprises the passive radiator 30 and the low frequency range amplification circuit 60 for amplifying the sound pressure in the frequency components of the low frequency range of the single audio signal input in the speaker unit 20, whereby the speaker unit 20 vibrates to emit sounds and the passive radiator 30 vibrates in resonance with vibration of the speaker unit 20 to emit sounds in a state where the low frequency range is amplified in the low frequency range amplification circuit 60. Thus, the sound, whose low frequency range is amplified, emitted from the speaker unit 20 and the sound emitted from the passive radiator 30 resonating with vibration of the speaker unit 20 where the low frequency range is amplified mix with each other, and hence the sound by the frequency components of the low frequency range can be fully emitted when the miniature speaker device 1 is downsized. The single audio signal output from the AGC circuit 50 has only to be input in the low frequency range amplification circuit 60 in order to amplify the sound pressure in the frequency components of the low frequency range, and hence the circuit structure can be simplified as compared with a case where two audio signals are input in the low frequency range amplification circuit 60. No motional feedback circuit must be provided on the passive radiator 30 in order to amplify the sound by the frequency components of the low frequency range, and hence the circuit structure can be simplified. The passive radiator 30 does not have a driving system such as a voice coil and hence increase in the number of components can be suppressed.

According to this embodiment, the low frequency range amplification circuit 60 is so formed that the sound pressure at a frequency of around 70 Hz, which is in the low frequency range, generated from the speaker device body and the sound pressure at a frequency of around 1 kHz are amplified to substantially the same level, whereby the frequency components of at around 70 Hz, which is in the low frequency range, generated from the speaker device body can be amplified to substantially the same level as the sound pressure at a frequency of around 1 kHz which is a standard frequency.

According to this embodiment, the low frequency range amplification circuit 60 is formed to most greatly amplify the sound pressure in the frequency components of the low frequency range of around 70 Hz, whereby the sound pressure at around 70 Hz, located on the lower frequency side at a frequency of at least 50 Hz and not more than 100 Hz and easily amplifiable to some extent is most greatly amplified, and hence the frequency components of the low frequency range generated from the speaker device body can be further reliably amplified.

According to this embodiment, the passive radiator 30 is so formed that the sound pressure in the frequency components of the low frequency range of at least 50 Hz and not more than 100 Hz is output to be larger than the sound pressure in the frequency components of more than 100 Hz, whereby the passive radiator 30 can further emphasis the sound pressure in the frequency components of the low frequency range of at least 50 Hz and not more than 100 Hz, and hence the frequency components in the low frequency range of at least 50 Hz and not more than 100 Hz can be fully amplified.

According to this embodiment, the frequency (50 Hz) at which sound pressure output from the passive radiator 30 reaches a maximum is located on a lower frequency side than the frequency (70 Hz) at which sound pressure is most greatly amplified in the low frequency range amplification circuit 60, whereby the sound pressure in a frequency range lower than the low frequency range amplified in the low frequency range amplification circuit 60 can be amplified in the passive radiator 30, and hence even the frequency components of the low frequency range which are difficult to be amplified by the low frequency range amplification circuit 60 can be fully amplified.

According to this embodiment, the weight of the corn paper 31 is so adjusted by the spindle 33 that the corn paper 31 resonate at a frequency of around 50 Hz in a state where the passive radiator 30 having no driving system is mounted on the speaker box 10, whereby the passive radiator 30 having no driving system resonates at a frequency of around 50 Hz which is in the low frequency range, so that the passive radiator 30 can be vibrated in resonance with vibration of the speaker unit 20 in the low frequency range of more than around 50 Hz. Thus, in the low frequency range of more than around 50 Hz, the sound emitted from the speaker unit 20 and the sound emitted from the passive radiator 30 mix with each other, and hence the miniature speaker devices 1 can fully emit the sound by the frequency components of the low frequency range. The passive radiator 30 is formed to resonate at around 50 Hz, whereby the sound pressure output from the passive radiator 30 reaches the maximum at around 50 Hz. Thus, the frequency components of the low frequency range at around 50 Hz which are difficult to be amplified by the low frequency range amplification circuit 60 can be fully amplified.

According to this embodiment, the AGC circuit 50 outputting the audio signal input in the low frequency range amplification circuit 60 and the power amplifier 70 receiving the audio signal output from the low frequency range amplification circuit 60 are provided on the main amplifier 40, whereby the low frequency range amplification circuit 60 amplifies the frequency components in the low frequency range of an output signal (audio signal) adjusted to a substantially constant by the AGC circuit 50, and hence dispersion of the audio signal output from the low frequency range amplification circuit 60 can be suppressed.

According to this embodiment, the speaker box 10 is formed to have a volume of about 500 cm³, whereby the sound by the frequency components in the low frequency range can be fully emitted even when the miniature speaker device 1 has a small volume such as about 500 cm³.

According to this embodiment, the low frequency range amplification circuit portion 60a having the capacitor 62b and the resistance 61c connected to the capacitor 62b in parallel is so formed as to attenuate the sound pressure in the frequency components of the high frequency range of the input single audio signal, whereby the input single audio signal can be returned to the operational amplifier 63 by the low frequency range amplification circuit portion 60a, and hence the input single audio signal can be amplified. The capacitor 62b and the resistance 61c connected to the capacitor 62b in parallel can attenuate the sound pressure in the frequency components of the high frequency range of the single audio signal input in the low frequency range amplification circuit portion 60a, and hence the sound pressure in the frequency components of the low frequency range can be amplified in the low frequency range amplification circuit 60.

According to this embodiment, the passive radiator 30 is not electrically connected to the AGC circuit 50, the low frequency range amplification circuit 60 and the power amplifier 70, while the speaker unit 20 is electrically connected to the AGC circuit 50, the low frequency range amplification circuit 60 and the power amplifier 70, whereby a driving portion is not required by not electrically connecting the passive radiator 30 to the AGC circuit 50, the low frequency range amplification circuit 60 and the power amplifier 70, and the sound pressure in the frequency components of the low frequency range can be amplified by the speaker unit 20 electrically connected to the AGC circuit 50, the low frequency range amplification circuit 60 and the power amplifier 70.

Measurement of the sound pressure frequency characteristic conducted for confirming effects of the aforementioned embodiment of the present invention will be now described with reference to FIGS. 2, 4 and 6 to 8.

Figure 6:
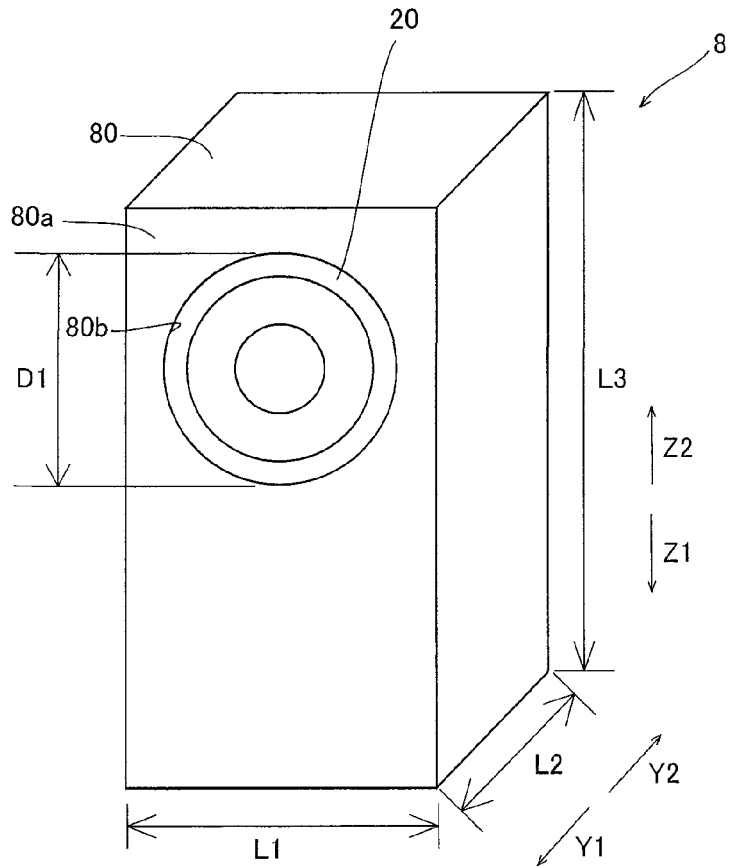
FIG. 6 is a perspective view showing a speaker device corresponding to a conventional type which is a comparative example of the miniature speaker device according to the embodiment of the present invention.

The measurement of the sound pressure frequency characteristic is conducted for the miniature speaker device 1 according to the embodiment of the present invention shown in FIG. 2 and a speaker device 8 according to a comparative example shown in FIG. 6. More specifically, a measuring instrument (not shown) is set at forward of the miniature speaker device 1 according to this embodiment and the speaker device 8 according to the comparative example, and the same audio signals are input in the miniature speaker device 1 according to this embodiment and the speaker device 8 according to the comparative example, thereby performing measurement.

As shown in FIG. 6, the speaker device 8 according to the comparative example is constituted by a speaker box 80 made of resin, a speaker unit 20 and a main amplifier (not shown). No passive radiator 30 (see FIG. 2) is provided on the speaker device 8 according to the comparative example dissimilarly to the miniature speaker device 1 (see FIG. 2) according to this embodiment. Thus, no hole 10c (see FIG. 2) for mounting the passive radiator 30 is provided on a front surface 80a of the speaker box 80. In other words, the speaker device 8 according to the comparative example is a so-called closed speaker device having no passive radiator. The main amplifier (not shown) of the speaker device 8 according to the comparative example is provided with no low frequency range amplification circuit 60 (see FIG. 4), dissimilarly to the miniature speaker device 1 according to this embodiment. The remaining structure of the speaker device 8 according to the comparative example is similar to that of the miniature speaker device 1 according to this embodiment.

Figure 7:
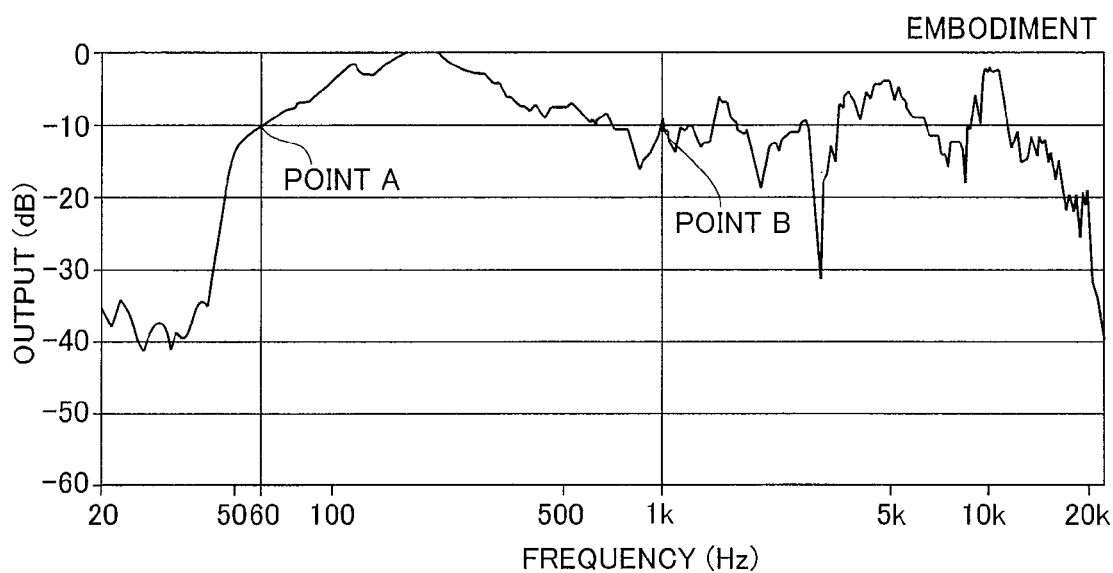
FIG. 7 is a diagram showing a sound pressure frequency characteristic of the miniature speaker device according to the embodiment of the present invention shown in FIG. 2.
Figure 8:
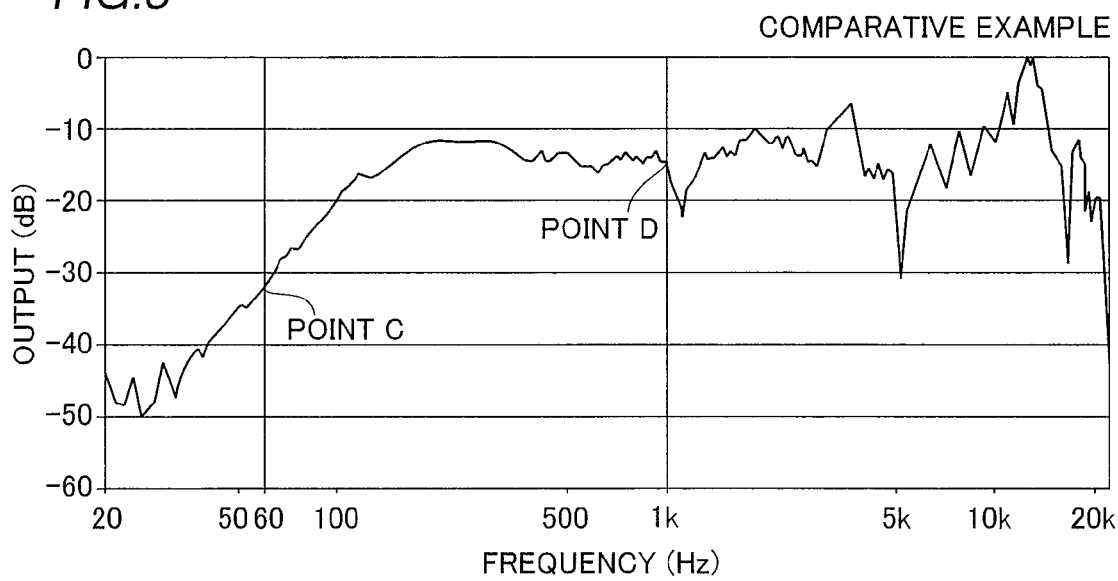
FIG. 8 is a diagram showing a sound pressure frequency characteristic of a speaker device corresponding to a conventional type which is a comparative example of the miniature speaker device according to the embodiment of the present invention.

The measurement results of change in output of the miniature speaker device 1 according to this embodiment and the aforementioned speaker device 8 according to the comparative example following change in frequency components of the miniature speaker device 1 according to this embodiment and the speaker device 8 according to the comparative example are shown in FIGS. 7 and 8.

Referring to FIGS. 7 and 8, the axis of ordinate shows output (dB), and the axis of abscissa shows a frequency (Hz). In the miniature speaker device 1 according to this embodiment, output of about −10 dB was obtained at 60 Hz (point A in FIG. 7) which is in the low frequency range as shown in FIG. 7. Output of about −10 dB was obtained at 1 kHz (point B in FIG. 7) which is in the mid frequency range. Thus, sound pressure at 60 Hz which is in the low frequency range and sound pressure at 1 kHz in the mid frequency range are substantially the same level, and hence it has been confirmed that the miniature speaker device 1 according to this embodiment can emit sounds by the frequency components in the low frequency range to substantially the same extent as the sound by the frequency components in the mid frequency range.

In the speaker device 8 according to the comparative example, on the other hand, output of about −32 dB was obtained at 60 Hz (point C in FIG. 8) which is in the low frequency range, as shown in FIG. 8. Output of about −15 dB was obtained at 1 kHz (point D in FIG. 8) which is in the mid frequency range. Thus, the sound pressure at 60 Hz which is in the low frequency range is smaller than the sound pressure at 1 kHz which is in the mid frequency range by substantially 17 dB, and hence it has been confirmed that the speaker device 8 according to the comparative example can not emit sounds by the frequency components in the low frequency range to substantially the same extent as the sound by the frequency components in the mid frequency range.

From these results, the miniature speaker device 1 comprises the passive radiator 30 and the low frequency range amplification circuit 60 for amplifying the sound pressure in the frequency components of the low frequency range of the audio signal, whereby it has been confirmed that the miniature speaker device 1 according to this embodiment can emit the sound by the frequency components in the low frequency range to substantially the same extent as the sound by the frequency components in the mid frequency range, and hence the sound by the frequency components in the low frequency range can be fully emitted.

Although the present invention has been described and illustrated in detail, it is clearly understood that the same is by way of illustration and example only and is not to be taken by way of limitation, the spirit and scope of the present invention being limited only by the terms of the appended claims.

While the sound pressure output from the main amplifier is adjusted to be amplified to the maximum at 70 Hz in the aforementioned embodiment, the present invention is not restricted to this but the frequency at which the sound pressure is amplified to the maximum is not restricted to 70 Hz so far as the frequency is an adjustable frequency. For example, a frequency of around 60 Hz smaller than 70 Hz may be applicable so far as it is the adjustable frequency.

While the sound pressure at 70 Hz output from the main amplifier is adjusted to be amplified by 10 dB than the sound pressure at 1 kHz in the aforementioned embodiment, the present invention is not restricted to this but the sound pressure at 70 Hz may be adjusted to be amplified by a value of at least about 10 dB or at most about 10 dB than the sound at 1 kHz so far as the sound pressure in the frequency components of the low frequency range can be amplified.

Figure 9:
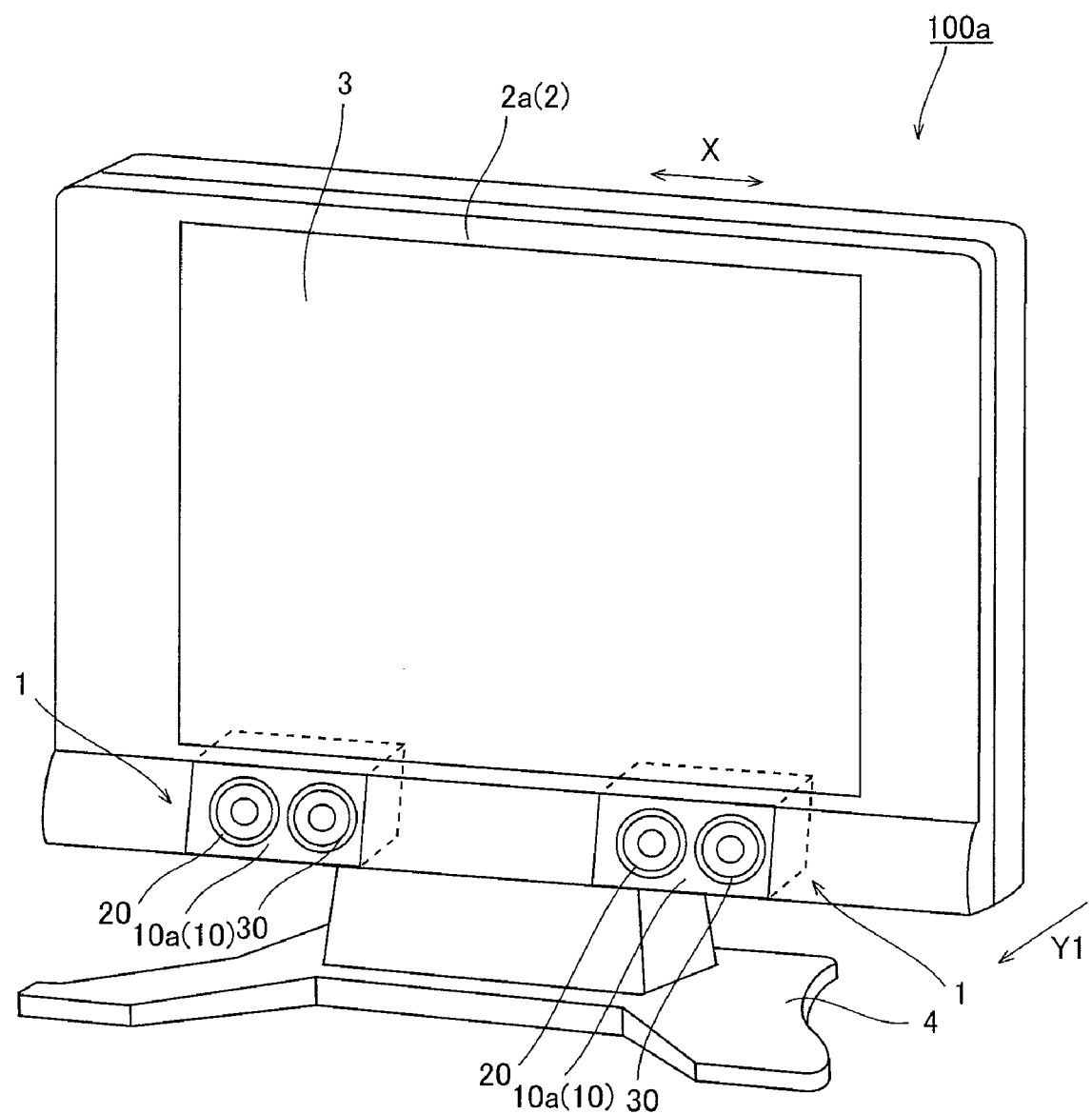
FIG. 9 is a perspective view for illustrating a thin television set according to a first modification of the embodiment of the present invention.

While the miniature speaker devices are provided on the both side surfaces of the screen display portion of the thin television set in the aforementioned embodiment, the present invention is not restricted. For example, a pair of miniature speaker devices 1 may be arranged on a lower portion (leg portion side) of an image display portion 3 of a thin television set 100a inside a television housing 2 as shown in a first modification in FIG. 9.

While the pair of miniature speaker devices are provided on the thin television set in the aforementioned embodiment, the present invention is not restricted to this but one or three or more miniature speaker devices may be provided on the thin television set.

While the speaker unit and the passive radiator are provided on the front surface (surface along arrow Y1 in FIG. 2) of the speaker box of each miniature speaker device in the aforementioned embodiment, the present invention is not restricted to this. For example, either one of the speaker unit and the passive radiator may be provided on the front surface of the speaker box and either the other of the speaker unit and the passive radiator may be provided on the back surface (surface along arrow Y2 in FIG. 2) of the speaker box.

Figure 10:
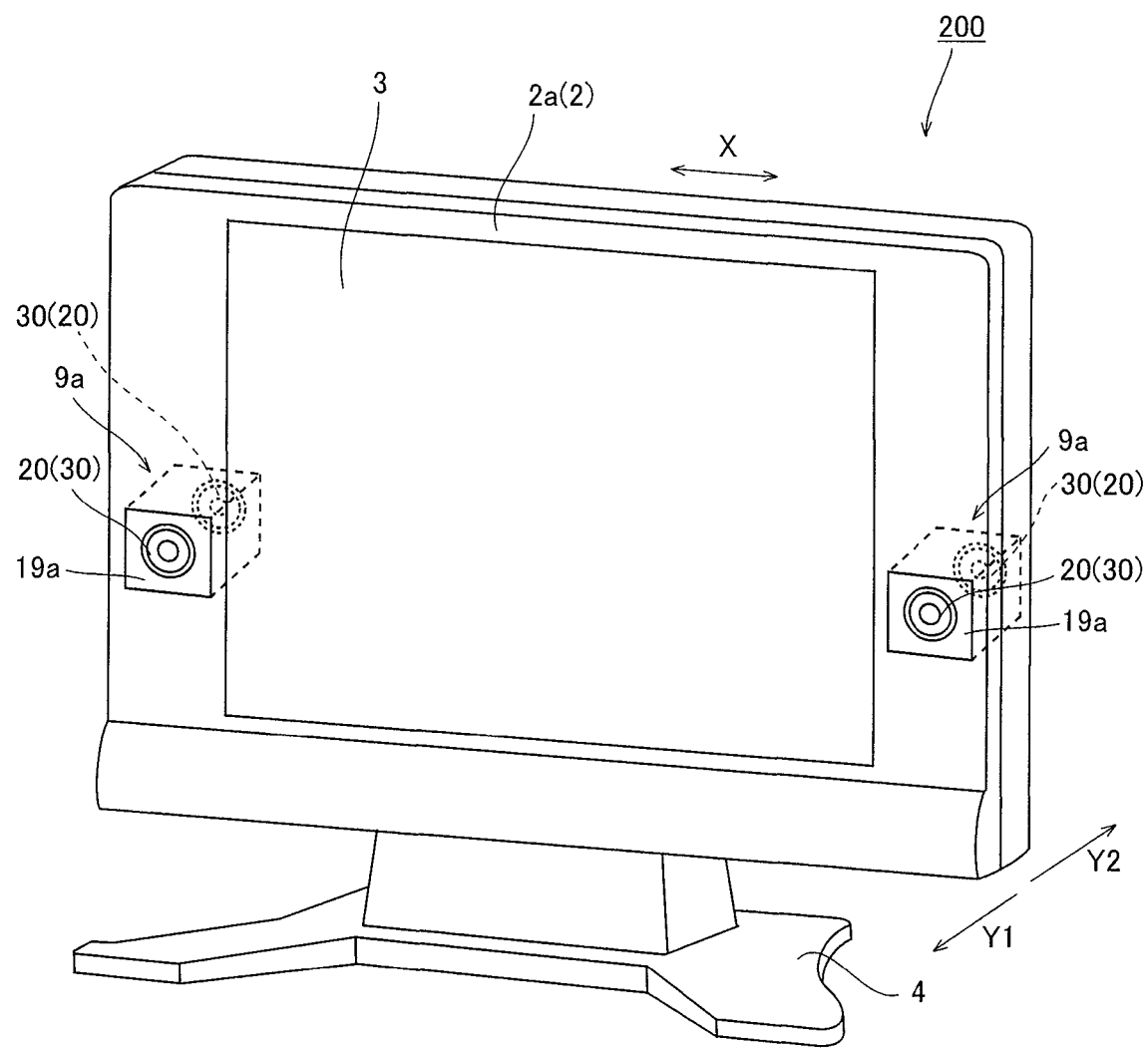
FIG. 10 is a perspective view for illustrating a thin television set according to a second modification of the embodiment of the present invention.
Figure 11:
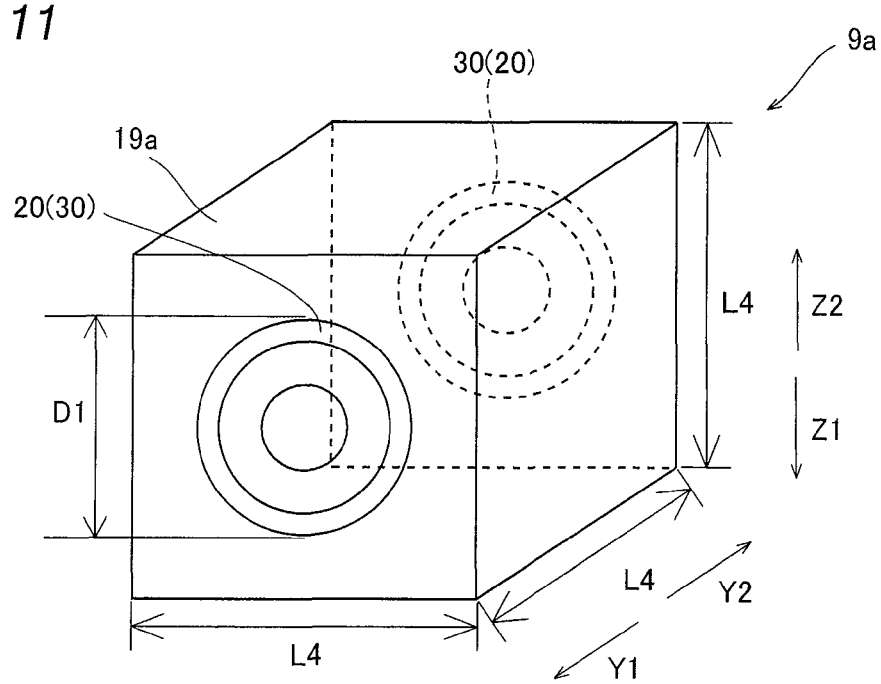
FIG. 11 is a perspective view for illustrating a miniature speaker device according to the second modification of the embodiment of the present invention.
Figure 12:
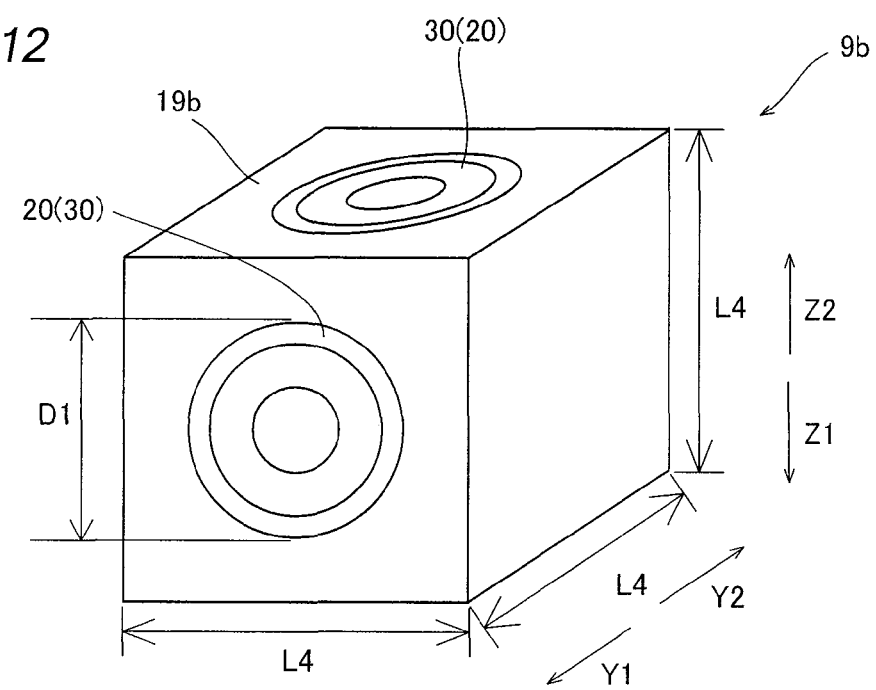
FIG. 12 is a perspective view for illustrating a miniature speaker device according to a third modification of the embodiment of the present invention.

While the speaker box of the miniature speaker device of the thin television set has a width (L1) of about 80 mm, a depth (L2) of about 50 mm and a height (L3) of about 150 mm, and is formed in a so-called rectangular solid in the aforementioned embodiment, the present invention is not restricted to this but the shape of the speaker box is not restricted so far as the volume of the speaker box is at least 400 cm$^3$ and not more than 1000 cm$^3$. For example, a speaker box 19a of a miniature speaker device 9a of a thin television set 200 may have a width of about 85 mm (L4 in FIG. 11), a depth of about 85 mm and a height of about 85 mm, and be formed in a so-called cube as in a second modification in FIGS. 10 and 11. In this case, the speaker unit 20 and the passive radiator 30 are provided on front and back surfaces (surfaces along arrows Y1 and Y2) respectively, as shown in FIG. 11. As in a third modification in FIG. 12, a speaker box 19b of a miniature speaker device 9b may have a width of about 85 mm (L4), a depth of about 85 mm and a height of about 85 mm, and the speaker unit 20 and the passive radiator 30 may be provided on a front surface (along arrow Y1) and an upper surface (along arrow Z2) of the speaker box 19b of the miniature speaker device 9b, respectively. The respective surfaces of the speaker boxes 19a and 19b according to the second and third modifications must be larger than the diameters (D1: diameter about 50 mm) of the speaker unit 20 and the passive radiator 30 so as to be mountable with the speaker unit 20 and the passive radiator 30.

While the volume of the speaker box of the miniature speaker device is about 500 cm$^3$ in the aforementioned embodiment, the present invention is not restricted to this but the volume may be smaller than about 500 cm$^3$. More specifically, the speaker box is formed to have a width (L1) of about 75 mm, a depth (L2) of about 47 mm and a height (L3) of about 140 mm, to have a volume of about 400 cm$^3$. The speaker box may be formed to have a volume smaller than about 400 cm$^3$.

According to the aforementioned embodiment, the volume of the speaker box of the miniature speaker device is about 500 cm$^3$ in the aforementioned embodiment, the present invention is not restricted to this but the volume may be more than about 500 cm$^3$. More specifically, the speaker box may be formed to have a width (L1) of about 100 mm, a depth (L2) of about 60 mm and a height (L3) of about 190 mm, to have a volume of about 1000 cm$^3$. The speaker box may be formed to have a volume of more than about 1000 cm$^3$, but at most 1000 cm$^3$ is preferable.

While the speaker unit and the passive radiator are formed to each have a diameter (D1) of about 50 mm in the aforementioned embodiment, the present invention is not restricted to this but they may be formed to each have a diameter of more than 50 mm so far as they can be mounted on the speaker box, or they may be formed to each have a diameter of not less than 50 mm so far as the sound by the frequency components in the low frequency range can be fully emitted.

While the sound pressure at 1 kHz output from the main amplifier is employed as a standard in the aforementioned embodiment, the present invention is not restricted to this but sound pressure at a frequency other than 1 kHz may be employed as a standard.

While the AGC circuit, the low frequency range amplification circuit and the power amplifier of the main amplifier are constituted by analog circuits such as resistances or bipolar transistors in the aforementioned embodiment, the present invention is not restricted to this but they may be constituted by digital circuits.

What is claimed is:

1. A miniature speaker device comprising:
   a housing;
   a speaker mounted on said housing;
   a passive radiator mounted on said housing and vibrating in resonance with vibration of said speaker and having no driving system;
   a low frequency range amplification circuit for amplifying sound pressure in frequency components of a low frequency range of a single audio signal input in said speaker; and
   an amplifier circuit for amplifying the audio signal output from said low frequency range amplification circuit.

2. The miniature speaker device according to claim 1, further comprising a speaker device body including said speaker and said passive radiator, wherein
   said low frequency range amplification circuit is so formed that sound pressure in the frequency components of at least 50 Hz and not more than 100 Hz which are in the low frequency range, generated from said speaker device body and sound pressure at a frequency of around 1 kHz are amplified to be substantially the same.

3. The miniature speaker device according to claim 2, wherein
   said low frequency range amplification circuit is so formed that sound pressure at a frequency of around 70 Hz which is in the low frequency range, generated from said speaker device body and the sound pressure at the frequency of around 1 kHz are amplified to be substantially the same.

4. The miniature speaker device according to claim 2, wherein
said low frequency range amplification circuit is so formed as to amplify the sound pressure in the frequency components of the low frequency range of at least 50 Hz and not more than 100 Hz.

5. The miniature speaker device according to claim 4, wherein
said low frequency range amplification circuit is so formed as to most greatly amplify the sound pressure at a frequency of the low frequency range of around 70 Hz.

6. The miniature speaker device according to claim 2, wherein
said passive radiator is so formed that sound pressure in the frequency components of the low frequency range of at least 50 Hz and not more than 100 Hz is output to be larger than sound pressure in frequency components of more than 100 Hz.

7. The miniature speaker device according to claim 6, wherein
a frequency at which sound pressure output from said passive radiator reaches a maximum is located on a lower frequency side than a frequency at which sound pressure is most greatly amplified in said low frequency range amplification circuit.

8. The miniature speaker device according to claim 7, wherein
said passive radiator having no driving system includes a corn vibrating in resonance with vibration of said speaker and a spindle for adjusting a weight of said corn, supported by said corn, and
the weight of said corn is so adjusted by said spindle that said corn resonates at a frequency of around 50 Hz in a state where said passive radiator having no driving system is mounted on said housing.

9. The miniature speaker device according to claim 1, further comprising:
an automatic gain control circuit outputting the audio signal input in said low frequency range amplification circuit and keeping output to said low frequency range amplification circuit substantially constant.

10. The miniature speaker device according to claim 9, wherein
said passive radiator is not electrically connected to said automatic gain control circuit, said low frequency range amplification circuit and said amplifier circuit, while said speaker is electrically connected to said automatic gain control circuit, said low frequency range amplification circuit and said amplifier circuit.

11. The miniature speaker device according to claim 1, wherein
said housing has a volume of at least 400 cm$^3$ and not more than 1000 cm$^3$.

12. The miniature speaker device according to claim 1, wherein
said low frequency range amplification circuit includes an operational amplifier and a feedback circuit portion connecting an input side and an output side of said operational amplifier and returning the input single audio signal from the output side of said operational amplifier to the input side of said operational amplifier, and
said feedback circuit portion attenuates sound pressure in frequency components of a high frequency range of the input single audio signal.

13. The miniature speaker device according to claim 12, wherein
said feedback circuit portion has at least a capacitor and a resistance connected to said capacitor in parallel.

14. A thin television set comprising a miniature speaker device including a housing, a speaker mounted on said housing, a passive radiator mounted on said housing and vibrating in resonance with vibration of said speaker and having no driving system, a low frequency range amplification circuit for amplifying sound pressure in frequency components of a low frequency range of a single audio signal input in said speaker, and an amplifier circuit for amplifying the audio signal output from said low frequency range amplification circuit.

15. The thin television set according to claim 14, wherein
said miniature speaker device further includes a speaker device body having said speaker and said passive radiator, and
said low frequency range amplification circuit is so formed that sound pressure in the frequency components of at least 50 Hz and not more than 100 Hz which are in the low frequency range, generated from said speaker device body and sound pressure at a frequency of around 1 kHz are amplified to be substantially the same.

16. The thin television set according to claim 15, wherein
said passive radiator is so formed that sound pressure in the frequency components of the low frequency range of at least 50 Hz and not more than 100 Hz is output to be larger than sound pressure in frequency components of more than 100 Hz.

17. The thin television set according to claim 16, wherein
a frequency at which sound pressure output from said passive radiator reaches a maximum is located on a lower frequency side than a frequency at which sound pressure is most greatly amplified in said low frequency range amplification circuit.

18. The thin television set according to claim 17, wherein
said passive radiator having no driving system has a corn vibrating in resonance with vibration of said speaker and a spindle for adjusting a weight of said corn, supported by said corn, and
the weight of said corn is so adjusted by said spindle that said corn resonates at a frequency of around 50 Hz in a state where said passive radiator having no driving system is mounted on said housing.

19. The thin television set according to claim 14, wherein
said miniature speaker device further includes an automatic gain control circuit outputting the audio signal input in said low frequency range amplification circuit and keeping output to said low frequency range amplification circuit substantially constant.

20. The thin television set according to claim 14, wherein
said low frequency range amplification circuit has an operational amplifier and a feedback circuit portion connecting an input side and an output side of said operational amplifier and returning the input single audio signal from the output side of said operational amplifier to the input side of said operational amplifier, and
said feedback circuit portion attenuates sound pressure in frequency components of a high frequency range of the input single audio signal.

* * * * *